United States Patent
Yoon (10) Patent No.: US 8,933,459 B2
(45) Date of Patent: Jan. 13, 2015

(54) ORGANIC LIGHT EMITTING DISPLAY DEVICE AND METHOD OF MANUFACTURING THE SAME

(71) Applicant: Joo Sun Yoon, Seoul (KR)

(72) Inventor: Joo Sun Yoon, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 41 days.

(21) Appl. No.: 13/906,480

(22) Filed: May 31, 2013

(65) Prior Publication Data

US 2014/0131672 A1 May 15, 2014

(30) Foreign Application Priority Data

Nov. 13, 2012 (KR) ........................ 10-2012-0128332

(51) Int. Cl.
*H01L 27/32* (2006.01)

(52) U.S. Cl.
CPC ........ *H01L 27/3262* (2013.01); *H01L 27/3265* (2013.01); *H01L 27/3276* (2013.01)
USPC .......... 257/72; 257/83; 257/E33.064; 438/34; 438/149

(58) Field of Classification Search
CPC ............ H01L 27/1214; H01L 27/3244; H01L 27/3246; H01L 27/3262; H01L 29/4908; H01L 27/3241; H01L 27/3265; H01L 2227/323; H01L 27/3258
USPC ................. 257/72, 83, E33.064; 438/34, 149
See application file for complete search history.

(56) References Cited

U.S. PATENT DOCUMENTS

| 7,906,898 B2 * | 3/2011 | Lee ............................... 313/504 |
| 7,977,144 B2 * | 7/2011 | Cho et al. ........................ 438/72 |
| 8,012,921 B2 * | 9/2011 | Park et al. ..................... 510/175 |
| 2008/0041823 A1 | 2/2008 | La et al. |

FOREIGN PATENT DOCUMENTS

| KR | 10-2003-0015063 A | 2/2003 |
| KR | 10-2008-0017576 A | 2/2008 |
| KR | 10-2011-0094535 A | 8/2011 |
| KR | 10-2012-0080321 A | 7/2012 |

* cited by examiner

*Primary Examiner* — Minh-Loan Tran
(74) *Attorney, Agent, or Firm* — Lee & Morse, P.C.

(57) ABSTRACT

Embodiments are directed to an organic light emitting display device, including a substrate, and a plurality of pixels, each pixel including a protrusion pattern and a trench area formed in the substrate, an organic light emitting device disposed on the substrate, a capacitor, the capacitor including a first capacitor electrode and a second capacitor electrode, a first transistor, the first transistor being coupled to a gate line extended in a row direction, a data line extended in a column direction crossing the row direction, and the first capacitor electrode, and a second transistor, the second transistor being coupled to the first capacitor electrode, a voltage line extended in the column direction, and the organic light emitting device, wherein the second capacitor electrode is branched from the voltage line, and the gate line and the first capacitor electrode are formed on and overlap the protrusion pattern.

18 Claims, 7 Drawing Sheets

ORGANIC LIGHT EMITTING DISPLAY DEVICE AND METHOD OF MANUFACTURING THE SAME

CROSS-REFERENCE TO RELATED APPLICATION

This U.S. non-provisional patent application claims priority under 35 U.S.C. §119 of Korean Patent Application No. 10-2012-0128332, filed on Nov. 13, 2012, the contents of which are hereby incorporated by reference.

BACKGROUND

1. Field

Embodiments relate to an organic light emitting display device and a method of manufacturing the organic light emitting display device.

2. Description of the Related Art

In recent years, various display devices, such as a liquid crystal display device, an organic light emitting display device, an electrowetting display device, a plasma display device, an electrophoretic display device, etc., have been developed.

Among them, the organic light emitting display device displays an image using an organic light emitting device that generates light by recombining electrons and holes. The organic light emitting display device has advantages of fast response speed and low power consumption.

The organic light emitting device of the organic light emitting display includes an anode, an organic light emitting layer, and a cathode. Holes and electrons are injected into the organic emitting layer through the anode electrode and the cathode electrode, and are recombined in the organic light emitting layer to generate excitons. The excitons emit energy, which is discharged when an excited state returns to a ground state, as light.

SUMMARY

Embodiments are directed to an organic light emitting display device, including a substrate, and a plurality of pixels, each pixel including a protrusion pattern and a trench area formed in the substrate, the protrusion pattern having a first height, and the trench area being formed in an area of the substrate except for the protrusion pattern and having a second height lower than the first height, an organic light emitting device disposed on the substrate, a capacitor, the capacitor including a first capacitor electrode and a second capacitor electrode, a first transistor, the first transistor being coupled to a gate line extended in a row direction, a data line extended in a column direction crossing the row direction, and the first capacitor electrode, and a second transistor, the second transistor being coupled to the first capacitor electrode, a voltage line extended in the column direction, and the organic light emitting device, wherein the second capacitor electrode is branched from the voltage line, and the gate line and the first capacitor electrode are formed on and overlap the protrusion pattern.

The protrusion pattern may have a protruding feature that has a same width as an overlapping portion of the gate line, and the protrusion pattern may have a protruding feature that has a same area as an overlapping portion of the first capacitor electrode when viewed in a plan view.

The first transistor may include a first gate electrode, the first gate electrode being branched from the gate line, a first source electrode, the first source electrode being branched from the data line, and a first drain electrode, the first drain electrode being coupled to the first capacitor electrode.

The second transistor may include a second gate electrode, the second gate electrode being branched from the first capacitor electrode, a second source electrode, the second source electrode being branched from the voltage line, and a second drain electrode, the second drain electrode being coupled to the organic light emitting device.

The first and second gate electrodes may be formed on and overlap a respective protruding feature of the protrusion pattern, and each of the first and second gate electrodes may have a same width as the respective protruding feature.

The organic light emitting display device may further include an insulating layer disposed on the substrate to cover the gate line, the first gate electrode, and the second gate electrode.

The data line except for a portion of the data line crossing the gate line and the voltage line except for a portion of the voltage line crossing the gate line may be disposed on the insulating layer in the trench area.

The organic light emitting display device may further include a protective layer, the protective layer being disposed on the substrate to cover the first and second transistors, and a pixel definition layer, the pixel definition layer being disposed on the protective layer. Each pixel may include an opening in the pixel definition layer, and a contact hole in the protective layer, the contact hole penetrating the protective layer to expose a portion of the second drain electrode.

The organic light emitting device may include a first electrode, the first electrode being coupled to the second drain electrode through the contact hole, the first electrode being partially exposed by the opening, an organic light emitting layer, the organic light emitting layer being disposed on the first electrode in the opening, and a second electrode, the second electrode being disposed on the organic light emitting layer.

A boundary of the organic light emitting layer may overlap the data line, the voltage line, and another gate line.

Embodiments are also directed to a method of manufacturing an organic light emitting display device, the method including preparing a substrate, forming a gate line extended in a row direction, and forming a gate electrode of a driving transistor, etching a portion of the substrate to a predetermined depth to etch a trench area in the substrate, an area of the substrate that is not etched forming a protrusion pattern having a first height, the trench area having a second height lower than the first height, and the gate line and the gate electrode of the driving transistor being on and overlapping the protrusion pattern, forming an insulating layer on the substrate to cover the gate line and the gate electrode of the driving transistor, forming a semiconductor layer on the insulating layer to cover the gate electrode of the driving transistor, forming a source electrode of the driving transistor and a drain electrode of the driving transistor on the insulating layer and the semiconductor layer, the source electrode of the driving transistor and the drain electrode of the driving transistor being spaced apart from each other, and forming a data line extended in a column direction crossing the row direction on the insulating layer, and forming an organic light emitting device coupled to the drain electrode of the driving transistor.

The method may further include forming a first capacitor electrode and a second capacitor electrode partially overlap the first capacitor electrode, the insulating layer being interposed between the first capacitor electrode and the second capacitor electrode, forming a switching transistor coupled the data line, the first capacitor electrode, and another gate line, and forming a voltage line extended in the column direction on the insulating layer. The first capacitor electrode may be formed on and overlap the protrusion pattern, the first capacitor electrode may be coupled to the gate electrode of the driving transistor, and the voltage line may be coupled to the second capacitor electrode and the source electrode of the driving transistor.

The data line except for a portion of the data line crossing the gate line and the voltage line except for a portion of the voltage line crossing the gate line may be formed on the insulating layer in the trench area.

The protrusion pattern may have a protruding feature that has a same width as the gate line overlapping the protrusion pattern, the protrusion pattern may have a protruding feature that has a same width as the gate electrode overlapping the protrusion pattern, and the protrusion pattern may have a protruding feature that has a same area as the first capacitor electrode overlapping the protrusion pattern when viewed in a plan view.

The method may further include forming a protective layer on the substrate to cover the driving transistor and the switching transistor, forming a contact hole through the protective layer to expose an area of the drain electrode of the driving transistor, and forming a pixel definition layer on the protective layer, the pixel definition layer having an opening formed therethrough.

Forming of the organic light emitting device may include forming a first electrode on the protective layer to be coupled to the drain electrode of the driving transistor through the contact hole, the first electrode being partially exposed through the opening, forming an organic light emitting layer on the first electrode, the organic light emitting layer being formed on the first electrode in the opening, and forming a second electrode on the pixel definition layer and the organic light emitting layer.

A boundary of the organic light emitting layer may overlap the data line, the voltage line, and the gate line.

Etching of the substrate may be performed by a wet etch method with phosphoric acid, nitric acid, and hydrofluoric acid.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

Spatially relative terms, such as "beneath," "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
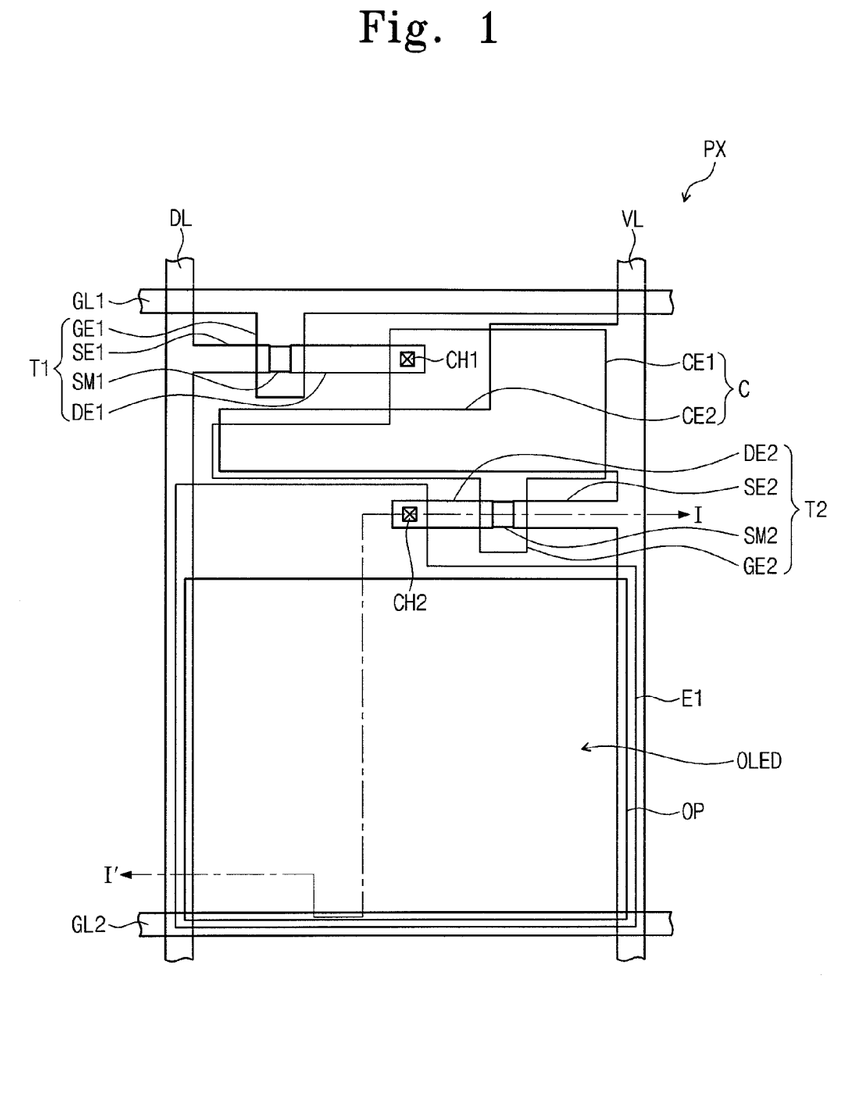
FIG. 1 is a plan view showing one pixel of an organic light emitting display device according to an example embodiment of the present disclosure.

FIG. 1 is a plan view showing one pixel of an organic light emitting display device according to an example embodiment of the present disclosure. The organic light emitting display device includes a plurality of pixels and the pixels have the same configuration and function. Accordingly, hereinafter, one pixel PX shown in FIG. 1 will be described in detail as a representative example.

In the example embodiment shown in FIG. 1, the pixel PX of the organic light emitting display device includes a capacitor C, a first transistor T1, a second transistor T2, and an organic light emitting device OLED. The first transistor T1 serves as a switching transistor and the second transistor T2 serves as a driving transistor.

The capacitor C includes a first capacitor electrode CE1 and a second capacitor electrode CE2; a second capacitor electrode CE2 overlaps the first capacitor electrode CE1 in a predetermined area. The second capacitor electrode CE2 is branched from a voltage line VL applied with a light emitting voltage. The first capacitor electrode CE1 and a second capacitor electrode CE2 face each other while interposing an insulating layer (refer to FIG. 2) therebetween. The first capacitor electrode CE1 is disposed under the insulating layer and the second capacitor electrode CE2 is disposed on the insulating layer.

The first transistor T1 is coupled to a first gate line GL1, a data line DL, and the first capacitor electrode CE1 of the capacitor C. The second transistor T2 is coupled to the first capacitor electrode CE1 of the capacitor C, the voltage line VL, and the organic light emitting device OLED.

The first gate line GL1 is extended in a row direction and receives a gate signal. The data line DL and the voltage line VL are extended in a column direction crossing the row direction. The data line DL receives a data signal and the voltage line VL receives the light emitting voltage. The second gate line GL2 shown in FIG. 1 is coupled to a next pixel (not shown) disposed under the pixel PX shown in FIG. 1.

Figure 2:
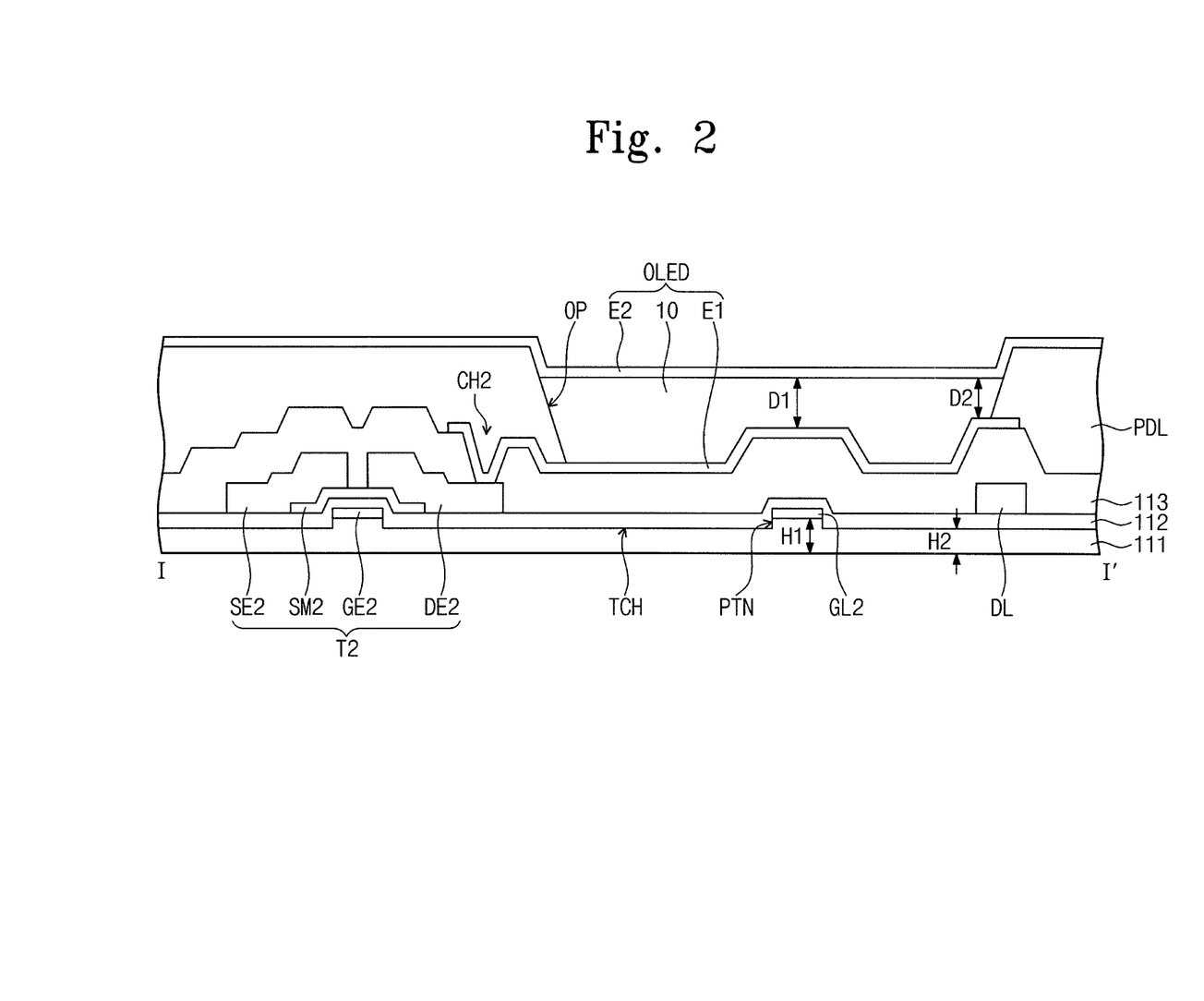
FIG. 2 is a cross-sectional view taken along a line I-I' shown in FIG. 1.

The organic light emitting device OLED is disposed in an opening OP formed by a pixel definition layer PDL (see FIG. 2). A predetermined area of a boundary of the opening OP overlaps the second gate line GL2, the data line DL, and the voltage line VL. The organic light emitting device OLED generates light corresponding to the light emitting voltage provided through the second transistor T2. The configuration of the organic light emitting device OLED will be described in further detail with reference to FIG. 2.

The first transistor T1 includes a first gate electrode GE1 branched from the first gate line GL1, a first source electrode SE1 branched from the data line DL, a first drain electrode DE1 coupled to the first capacitor electrode CE1, and a first semiconductor layer SM1 that forms a conductive channel between the first source electrode SE1 and the first drain electrode DE1. The first drain electrode DE1 is coupled to the first capacitor electrode CE1 through a first contact hole CH1. Although not shown in FIG. 1, the first contact hole CH1 is formed penetrating through the insulating layer disposed on the first capacitor electrode CE1 to expose a predetermined area of the first capacitor electrode CE1.

The second transistor T2 includes a second electrode GE2 branched from the first capacitor electrode CE1, a second source electrode SE2 branched from the voltage line VL, a second drain electrode DE2 coupled to the organic light emitting device OLED, and a second semiconductor layer SM2 that forms a conductive channel between the second source electrode SE1 and the second drain electrode DE2. The second drain electrode DE2 is coupled to the organic light emitting device OLED through the first electrode E1. The second drain electrode DE2 is coupled to the first electrode E1 through a second contact hole CH2.

FIG. 2 is a cross-sectional view taken along a line I-I' shown in FIG. 1.

Referring to FIG. 2, the second gate electrode GE2 of the second transistor T2 and the second gate line GL2 are disposed on the substrate 111. The substrate 111 includes a protrusion pattern PTN. The substrate 111 includes a trench area TCH formed in an area except for the protrusion pattern PTN. A first height H1 between a lower surface of the substrate 111 and an upper surface of the protrusion pattern PTN is higher than a second height H2 between the lower surface of the substrate 111 and an upper surface of the trench area TCH.

The second gate line GL2 and the second gate electrode GE2 are disposed on the protrusion pattern PTN to overlap with the protrusion pattern PTN. Each of the second gate line GL2 and the second gate electrode GE2 has the same width as that of a protruding feature of the protrusion pattern PTN.

Since the second gate electrode GE2 is branched from the first capacitor electrode CE1 (not shown in FIG. 2), the first capacitor electrode CE1 may be disposed on the protrusion pattern PTN to overlap with the protrusion pattern PTN. The first capacitor electrode CE1 has the same width as a protruding feature of the protrusion pattern PTN. That is, an area of the first capacitor electrode CE1 is equal to an area of a protruding feature of the protrusion pattern PTN when viewed in a plan view.

The first gate line GL1 and the second gate line GL2 are coupled to different pixels, but the first and second gate lines GL1 and GL2 have the same configuration. Therefore, the first gate line GL1 is formed on the protrusion pattern PTN to overlap with the protrusion pattern PTN (not shown in FIG. 2). In addition, the first gate electrode GE1 branched from the first gate line GL1 is formed on the protrusion pattern PTN to overlap with the protrusion pattern PTN. Each of the first gate line GL1 and the first gate electrode GE1 has the same width as that of a protruding feature of the protrusion pattern PTN.

The insulating layer 112 is disposed on the substrate 111 to cover the second gate electrode GE2 and the second gate line GL2. The data line DL is disposed on the insulating layer 112. The data line DL is disposed on the insulating layer 112 in the trench area TCH except for the area in which the second gate line GL2 crosses the data line DL.

The insulating layer 112 is disposed on the substrate 111 to cover the first gate electrode GE1, the first gate line GL1, and the first capacitor electrode CE1. The second capacitor electrode CE2 is disposed on the insulating layer 112. The voltage line VL is disposed on the insulating layer 112. The voltage line VL is disposed on the insulating layer 112 in trench area TCH except for an area in which the second gate line GL2 crosses the voltage line VL.

The second semiconductor layer SM2 of the second transistor T2 is disposed on the insulating layer 112 that covers the second gate electrode GE2. The second semiconductor layer SM2 includes an active layer and an active contact layer. The second semiconductor layer SM2 is formed of an inorganic semiconductor material, e.g., amorphous silicon or polysilicon, or an organic semiconductor material. In addition, the second semiconductor layer SM2 may be formed of an oxide semiconductor.

The second source electrode SE2 and the second drain electrode DE2 of the second transistor T2 are disposed on the second semiconductor layer SM2 of the second transistor T2 and the insulating layer 112 to be spaced apart from each other. The second semiconductor layer SM2 forms the conductive channel between the second source electrode SE2 and the second drain electrode DE2.

The first gate electrode GE1, the first source electrode SE1, the first drain electrode DE1, and the first semiconductor layer SM1 of the first transistor T1 are stacked in the same way as that of the second transistor T2. Thus, details of the configuration of the first transistor T1 will not be repeated.

A protective layer 113 is disposed on the substrate 111 to cover the second transistor T2. The protective layer 113 is disposed on the substrate 111 to cover the first transistor T1, the data line DL, and the voltage line VL.

The second contact hole CH2 is formed penetrating through the protective layer 113 to expose a portion of the second drain electrode DE2 of the second transistor T2. The first electrode E1 is disposed on the protective layer 113 to correspond to the pixel PX. The first electrode E1 is coupled to the second drain electrode DE2 of the second transistor T2 through the second contact hole CH2 formed through the protective layer 113. The first electrode E1 serves as a pixel electrode or an anode electrode.

The pixel definition layer PDL is disposed on the protective layer 113. The pixel definition layer PDL includes the opening OP formed therethrough to correspond to the pixel PX. The pixel definition layer PDL is formed to cover a boundary of the first electrode E1. The opening OP of the pixel definition layer PDL exposes the portion of the first electrode E1. The pixel definition layer PDL may be formed of, e.g., an organic insulating layer, or by sequentially stacking an inorganic insulating layer and an organic insulating layer, etc.

An organic light emitting layer 10 is disposed on the first electrode E1 in the opening OP of the pixel definition layer PDL. The second electrode E2 is disposed on the pixel definition layer PDL and the organic light emitting layer 10. The second electrode E2 serves as a common electrode or a cathode electrode.

The organic light emitting display device according to the present example embodiment is a front surface light emitting type. That is, the light emitted from the organic light emitting layer 10 travels in an upper direction of the organic light emitting layer 10. In the front surface light emitting type organic light emitting display device, the first electrode E1 is formed as a reflective electrode and the second electrode E2 is formed as a transmissive electrode. The first electrode E1 may have a positive polarity to inject the holes and the second electrode E2 has a negative polarity to inject the electrons, but the first and second electrodes E1 and E2 may have negative and positive polarities, respectively, in accordance with the driving method of the organic light emitting display device.

The organic light emitting layer 10 may be formed of a low molecular organic material or a high molecular organic material. The organic light emitting layer 10 may have a multi-layer structure of a hole injection layer, a hole transport layer, an emission layer, an electron transport layer, and an electron injection layer. As an example, the hole injection layer may be disposed on the first electrode E1 with the positive polarity, and the hole transport layer, the emission layer, the electron transport layer, and electron injection layer may be sequentially stacked on the hole injection layer.

The predetermined area of the boundary of the opening OP overlaps the second gate line GL2, the data line DL, and the voltage line VL. Accordingly, the predetermined area of the boundary of the organic light emitting layer 10 disposed in the opening OP may overlap the second gate line GL2, the data line DL, and the voltage line VL.

In FIG. 2, the organic light emitting layer 10 is disposed only in the opening OP of the pixel definition layer PDL, but the hole injection layer, the hole transport layer, the electrode transport layer, and the electron injection layer of the organic light emitting layer 10 may be formed in an area except for the opening OP, and the emission layer of the may be formed in the opening OP. The organic light emitting layer 10 may include an organic material that generates red, green, and/or blue light. In an implementation, the organic light emitting display device may display a white light by combining red, green, and blue lights.

The organic light emitting device OLED includes the first electrode E1, the organic light emitting layer 10, and the second electrode E2. The organic light emitting device OLED may emit the red, green, blue, and/or white lights in accordance with the flows of current, thereby displaying the image.

The light emitting voltage is applied to the first electrode E1 through the second transistor T2 to allow the organic light emitting layer 10 to emit the light. A voltage having an opposite polarity to that of the light emitting voltage is applied to the second electrode E2. In this case, the holes and the electrons, which are injected into the organic light emitting layer 10, are recombined with each other to generate excitons. The organic light emitting layer 10 emits the light while an excited state of the excitons returns to a ground state.

A portion of the light emitted from the organic light emitting layer 10 travels in the upper direction after passing through the second electrode E2 formed of the transmissive electrode. The other portion of the light is reflected by the first electrode E1 formed of the reflective electrode, and then travels in the upper direction after passing through the second electrode E2 disposed on the organic light emitting layer 10.

In the front surface light emitting type organic light emitting display device, lines disposed under the organic light emitting layer 10 does not exert influence on an aperture ratio of the front surface light emitting type organic light emitting display device. For instance, the gate lines GL1 and GL2, the data line DL, and the voltage line VL may be formed of a metal material that blocks the light. When the opening OP, in which the organic light emitting layer 10 is formed, is broadened, the predetermined area of the opening OP may overlap the gate lines GL1 and GL2, the data line DL, and the voltage line VL. However, the front surface light emitting type organic light emitting display device emits the light to travel in the upper direction of the organic light emitting layer 10. That is, since the light travels in the upper direction of the organic light emitting layer 10, the light may not be blocked by the gate lines GL1 and GL2, the data line DL, and the voltage line VL.

The aperture ratio indicates a ratio of the area of the pixel PX, through which the light is provided to a viewer, with respect to the total area of the pixel PX. Accordingly, the gate lines GL1 and GL2, the data line DL, and the voltage line VL, which are disposed under the organic light emitting layer 10, do not exert influence on the aperture ratio of the pixel PX.

A step difference occurs on the protective layer 113 that covers the second gate line GL2 and the data line DL, which is caused by a thickness of the second gate line GL2 and the data line DL. The data line DL has the thickness greater than the thickness of the second gate line GL2.

Due to the step difference occurring on the protective layer 113, the first electrode E1 has the same step difference thereon as the protective layer 113. In this case, the lower surface of the organic light emitting layer 10 disposed on the first electrode E1 in the opening OP has the step difference as shown in FIG. 2 by the protective layer 113 and the first electrode E1.

A height difference between the lower surface and the upper surface of the organic light emitting layer 10 overlapping the second gate line GL2 is referred to as a first step difference D1, and a height difference between the lower surface and the upper surface of the organic light emitting layer 10 overlapping the data line DL is referred to as a second step difference D2. The first step difference D1 may be greater than the second step difference D2, but the first step difference D1 may be the same as the second step difference D2 according to the thickness of the data line DL.

In a case that the trench area TCH is not formed in the substrate 111, the entire area of the substrate 111 has the first height H1. In this case, the position of the data line DL becomes higher than the position thereof shown in FIG. 2 by a difference between the first height H1 and the second height H2. Thus, the step difference of the organic light emitting layer 10 overlapping the data line DL becomes smaller than the second step difference D2 shown in FIG. 2. That is, when the trench area TCH does not exist, a difference between the first step difference D1 and the step difference of the organic light emitting layer 10 overlapping the data line DL becomes larger than the difference between the first step difference D1 and the second step difference D2 shown in FIG. 2.

The voltage line VL has the same thickness as that of the data line DL. Thus, when the trench area TCH is not formed, the difference between the first step difference D1 and the step difference of the organic light emitting layer 10 overlapping the voltage line VL becomes larger than the difference between the first step difference D1 and the second step difference D2 shown in FIG. 2. When the voltage line VL and the data line DL have the same thickness, hereinafter the second step difference D2 caused by the data line DL will be described in detail.

A current concentration phenomenon occurs in an area of the organic light emitting layer 10, which have a relatively low step difference in the organic light emitting layer 10. In this case, a life span of the organic light emitting device OLED may be shortened by heat generated by the current concentration phenomenon. Accordingly, it is important to reduce the step difference of the organic light emitting layer 10.

The substrate 111 of the organic light emitting display device according to the present example embodiment includes the protrusion pattern PTN having the first height H1 and the trench area TCH having the second height H2 lower than the first height H1. The position of the data line DL disposed on the insulating layer 112 of the trench area TCH may be lowered more than that when the trench area TCH is not formed. Accordingly, when the trench area TCH is not formed, the difference between the first step difference D1 and the second step difference D2 becomes smaller than the difference between the first step difference D1 and the step difference of the organic light emitting layer 10 overlapping the data line DL. That is, the step difference of the organic light emitting layer 10 may be reduced. When the step difference of the organic light emitting layer 10 is reduced, the current concentration phenomenon is eased, thereby improving the life span of the organic light emitting device OLED.

Consequently, the organic light emitting display device according to the present example embodiment may reduce the step difference of the organic light emitting layer 10, and thus the life span of the organic light emitting device OLED may be improved.

Figure 3:
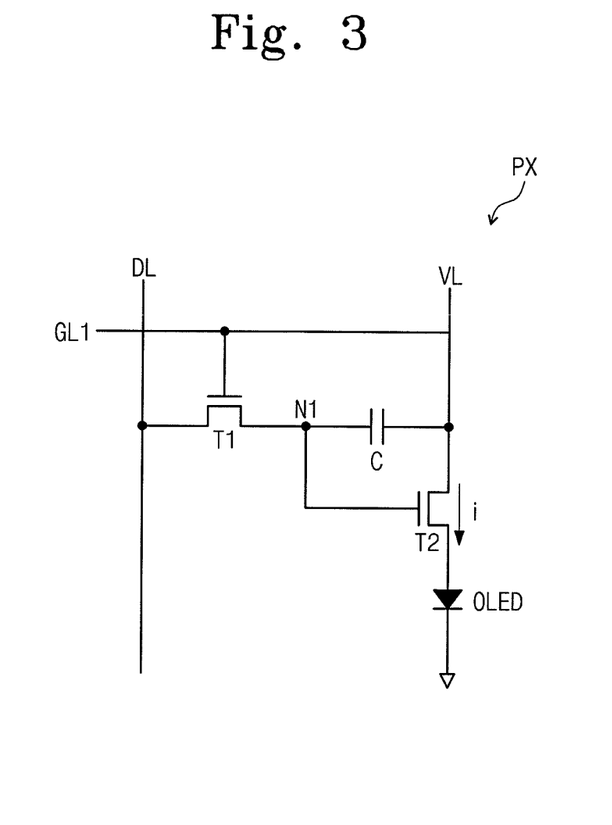
FIG. 3 is an equivalent circuit diagram showing the pixel shown in FIG. 1.

FIG. 3 is an equivalent circuit diagram showing the pixel shown in FIG. 1.

Referring to FIG. 3, the pixel PX of the organic light emitting display device includes the capacitor C, the first transistor T1, the second transistor T2, and the organic light emitting device OLED.

The first transistor T1 is coupled to the first gate line GL1, the data line DL, and the capacitor C. The second transistor T2 is coupled to the capacitor C, the voltage line VL, and the organic light emitting device OLED.

The first gate line GL1 receives a gate signal. The first transistor T1 is turned on in response to the gate signal. The turned-on first transistor T1 applies a data voltage provided through the data line DL to the first node N1. The capacitor C is charged with the data voltage provided to the first node N1 and maintained in the data voltage after the first transistor T1 is turned off. The second transistor T2 is turned on in response to the data voltage charged in the capacitor C. The second transistor T2 is turned on until the data voltage charged in the capacitor C is completely discharged to apply the light emitting voltage provided from the voltage line VL to the organic light emitting device OLED.

The first electrode E1 of the organic light emitting device OLED is coupled to an output terminal of the second transistor T2 and the second electrode E2 of the organic light emitting device OLED is coupled to a ground terminal. The holes are injected into the emission layer from the first electrode E1 through the hole injection layer and the hole transport layer and the electrons are injected into the emission layer from the second electrode E2 through the electron injection layer and the electron transport layer. Thus, the holes and electrons are recombined with each other in the emission layer, so that the light is emitted from the emission layer.

FIGS. 4A to 4G are views showing a method of manufacturing an organic light emitting display device according to an example embodiment of the present disclosure. FIGS. 4A to 4G shows cross-sectional views taken along the line I-I' shown in FIG. 2.

The first gate line GL1 has the same configuration as the second gate line GL2 and the first transistor T1 has the same stack configuration as the second transistor T2. The second gate electrode GE2 of the second transistor T2 is branched from the first capacitor electrode CE1. The voltage line VL is formed on the same layer as the data line, and the second capacitor electrode CE2 and the second source electrode SE2 of the second transistor T2 are branched from the voltage line VL. Thus, hereinafter, the second gate line GL2, the second transistor T2, and the data line DL will be described in detail with reference to FIGS. 4A to 4G and the first gate line GL1, the first transistor T1, the capacitor C, and the voltage line VL will be described without figures.

Figure 4A:
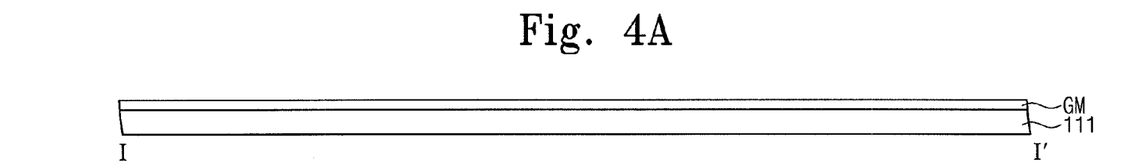
FIGS. 4A to 4G are views showing a method of manufacturing an organic light emitting display device according to an example embodiment of the present disclosure.
Figure 4B:
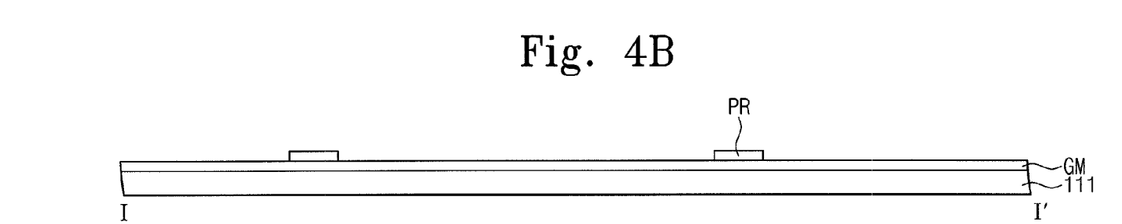

Referring to FIGS. 4A and 4B, when the substrate 111 is prepared, a gate metal layer GM is formed on the substrate 111. A photoresist pattern PR is formed on the gate meal layer GM to correspond to the areas in which the second gate line GL2 and the second gate electrode GE2 of the second transistor T2 are formed. Although not shown in figures, the photoresist pattern PR may be formed in the areas in which the first capacitor electrode CE1 of the capacitor C and the first gate line GL1 are formed.

Figure 4C:
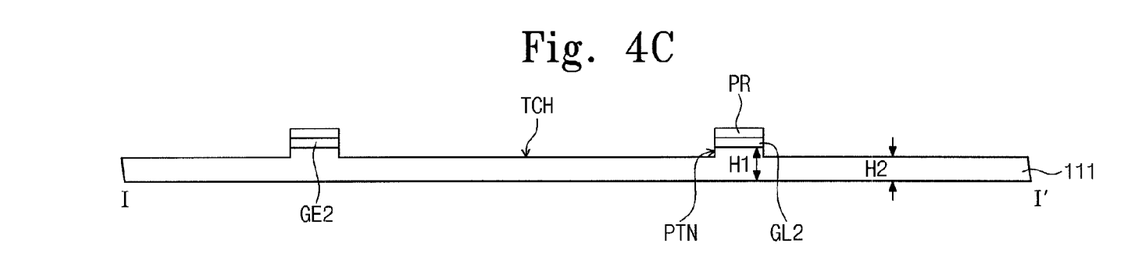

Referring to FIG. 4C, the gate metal layer GM is etched using the photoresist pattern PR as a mask. In addition, the substrate 111 is partially etched using the photoresist pattern PR as a mask. A wet etch method with phosphoric acid, nitric acid, and hydrofluoric acid may be used as the etch method. The etch process is performed during a time period longer than a time period required to etch the gate metal layer GM. That is, the time period for the etch process is set to allow the substrate 111 to be partially etched by a predetermined depth after the gate metal layer GM is etched.

Through the etch process, the second gate line GL2 and the second gate electrode GE2 are formed on the substrate 111. In addition, the protrusion pattern PTN of the substrate 111 is formed to overlap with the second gate line GL2 and the second gate electrode GE2. The trench area TCH of the substrate 111 is formed in the area except for the area in which the protrusion pattern PTN is formed to overlap with the second gate line GL2 and the second gate electrode GE2. The protrusion pattern PTN has the first height H1 and the trench area TCH has the second height H2 lower than the first height H1.

Although not shown in figures, the first capacitor electrode CE1 and the first gate line GL1 are formed on the substrate 111 by an etch process. In addition, the protrusion pattern PTN is formed to overlap with the first capacitor electrode CE1 and the first gate line GL1. The trench area TCH of the substrate 111 is formed in the area except for the area in which the protrusion pattern PTN is formed to overlap with the first capacitor electrode CE1 and the first gate line GL1.

Figure 4D:
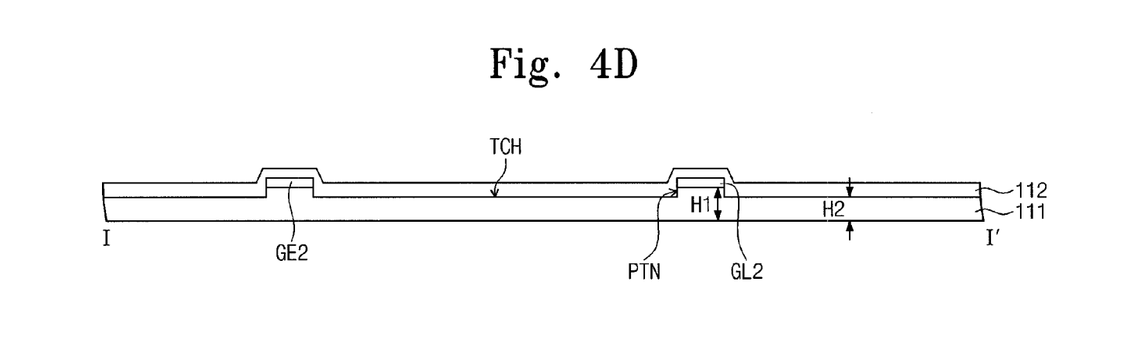

Referring to FIG. 4D, the insulating layer 112 is formed on the substrate 111 to cover the second gate line GL2 and the second gate electrode GE2. Although not shown in figures, the insulating layer 112 may be formed to cover the first capacitor electrode CE1 and the first gate line GL1.

Figure 4E:
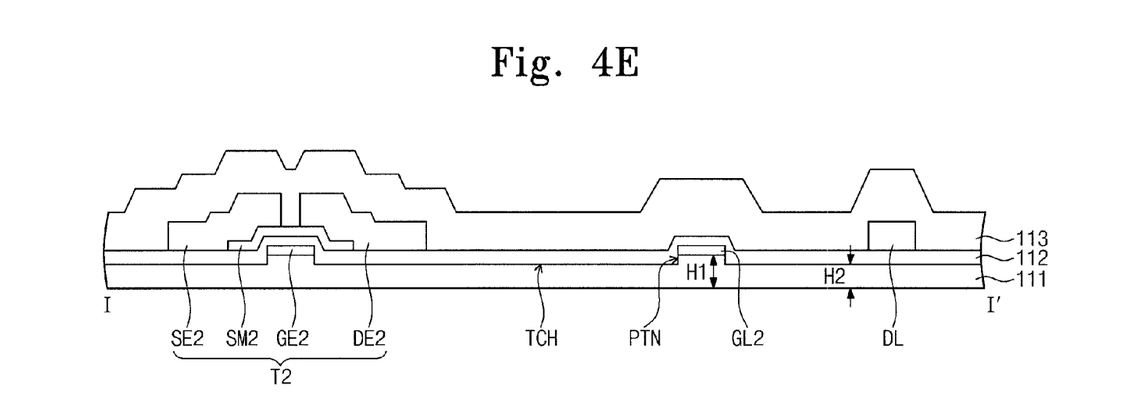

Referring to FIG. 4E, the second semiconductor layer SM2 is formed on the insulating layer 112 to cover the second gate electrode GE2. The second source electrode SE2 and the second drain electrode DE2 of the second transistor T2 are formed on the insulating layer 112 and the second semiconductor layer SM2 to be spaced apart from each other.

The data line DL is formed on the insulating layer 112 in the trench area TCH except for the portion of the data line DL crossing with the second gate line GL2. The protective layer 113 is formed on the substrate 111 to cover the second transistor T2 and the data line DL.

Although not shown in figures, the first transistor T1 is formed on the substrate 111. The first transistor T1 is formed in the same way as the second transistor T2, and thus details of the first transistor T1 will not be repeated.

Although not shown in figures, the voltage line VL is formed on the insulating layer 112 in the trench area TCH except for the portion of the voltage line VL crossing with the second gate line GL2. The second capacitor electrode CE2 branched from the voltage line VL may be formed on the insulating layer 112. The first and second capacitor electrodes CE1 and CE2 are formed to partially overlap each other with the insulating layer 112 interposed therebetween. The second source electrode SE2 is branched from the voltage line VL. The protective layer 113 is formed to cover the first transistor T1 and the voltage line VL.

Figure 4F:
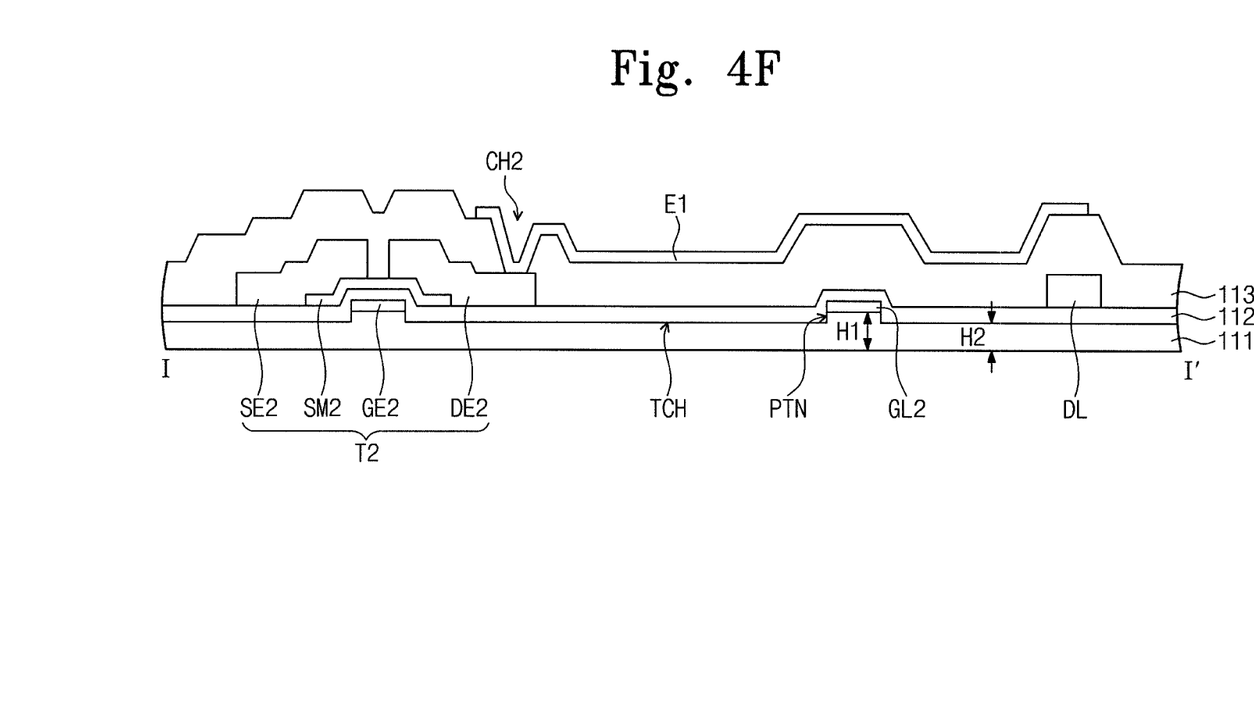

Referring to FIG. 4F, the second contact hole CH2 is formed through the protective layer 113 to expose the portion of the second drain electrode DE2 of the second transistor T2. The first electrode E1 is formed on the protective layer 113 to make contact with the second drain electrode DE2 of the second transistor T2 through the second contact hole CH2.

Figure 4G:
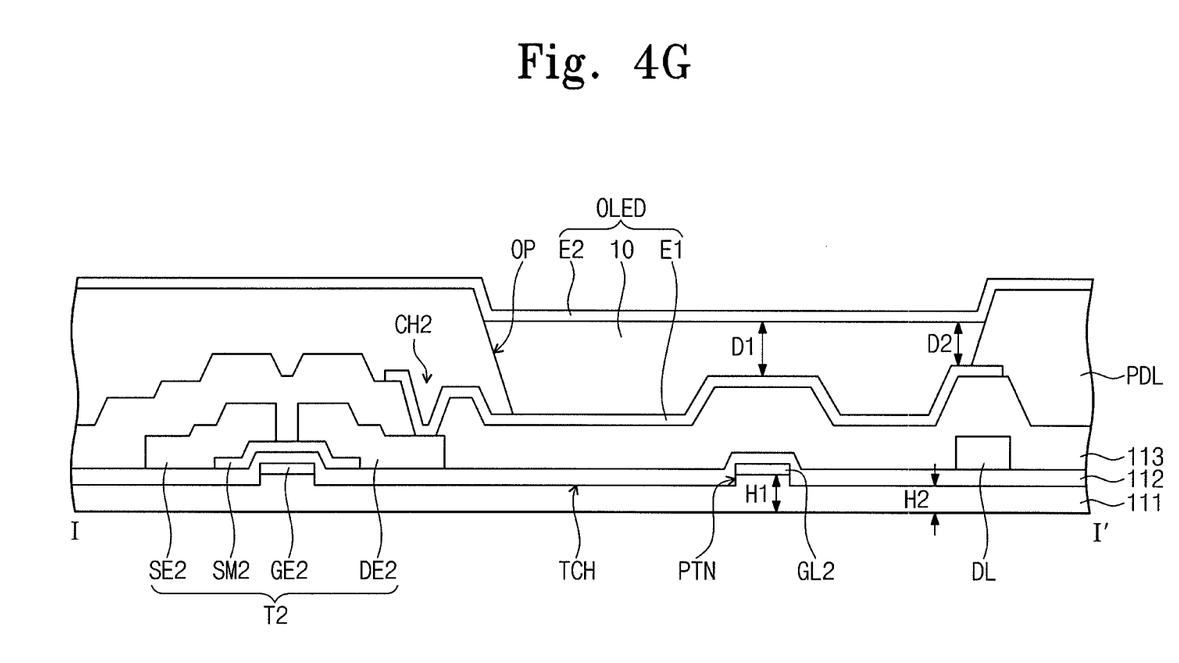

Referring to FIG. 4G, the pixel definition layer PDL is formed on the protective layer 113 to have the opening OP corresponding to the pixel PX. The organic light emitting layer 10 is disposed on the first electrode E1 in the opening OP of the pixel definition layer PDL. The second electrode E2 is formed on the pixel definition layer PDL and the organic light emitting layer 10.

The substrate 111 of the organic light emitting display device manufactured by the above-mentioned method includes the protrusion pattern PTN having the first height H1 and the trench area TCH having the second height H2 lower than the first height H1. The position of the data line DL formed on the insulating layer 112 in the trench area TCH may be lowered as compared to that when the trench area TCH is not formed. Thus, when the trench area TCH is not formed, the difference between the first step difference D1 and the second step difference D2 becomes smaller than the difference between the first step difference D1 and the step difference of the organic light emitting layer 10 overlapping the data line DL. That is, the step difference of the organic light emitting layer 10 is reduced. When the step difference of the organic light emitting layer 10 is reduced, the current concentration phenomenon is eased, thereby improving the life span of the organic light emitting device OLED.

Consequently, the organic light emitting display device according to the present example embodiment may reduce the step difference of the organic light emitting layer 10, and thus the life span of the organic light emitting device OLED may be improved.

As described above, embodiments provide an organic light emitting display device in which a step difference of an organic light emitting layer may be reduced. Embodiments also provide a method of manufacturing the organic light emitting display device. The organic light emitting display device may reduce the step difference of the organic light emitting layer, thereby improving the life span of the organic light emitting layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   a substrate; and
   a plurality of pixels, each pixel including:
   a protrusion pattern and a trench area formed in the substrate, the protrusion pattern having a first height, and the trench area being formed in an area of the substrate except for the protrusion pattern and having a second height lower than the first height;
   an organic light emitting device disposed on the substrate;
   a capacitor, the capacitor including a first capacitor electrode and a second capacitor electrode;
   a first transistor, the first transistor being coupled to a gate line extended in a row direction, a data line extended in a column direction crossing the row direction, and the first capacitor electrode; and
   a second transistor, the second transistor being coupled to the first capacitor electrode, a voltage line extended in the column direction, and the organic light emitting device, wherein the second capacitor electrode is branched from the voltage line, and the gate line and the first capacitor electrode are formed on and overlap the protrusion pattern.

2. The organic light emitting display device as claimed in claim 1, wherein:
   the protrusion pattern has a protruding feature that has a same width as an overlapping portion of the gate line, and
   the protrusion pattern has a protruding feature that has a same area as an overlapping portion of the first capacitor electrode when viewed in a plan view.

3. The organic light emitting display device as claimed in claim 2, wherein the first transistor includes:
   a first gate electrode, the first gate electrode being branched from the gate line;
   a first source electrode, the first source electrode being branched from the data line; and
   a first drain electrode, the first drain electrode being coupled to the first capacitor electrode.

4. The organic light emitting display device as claimed in claim 3, wherein the second transistor includes:

a second gate electrode, the second gate electrode being branched from the first capacitor electrode;

a second source electrode, the second source electrode being branched from the voltage line; and a second drain electrode, the second drain electrode being coupled to the organic light emitting device.

5. The organic light emitting display device as claimed in claim 4, wherein the first and second gate electrodes are formed on and overlap a respective protruding feature of the protrusion pattern, and each of the first and second gate electrodes has a same width as the respective protruding feature.

6. The organic light emitting display device as claimed in claim 4, further comprising an insulating layer disposed on the substrate to cover the gate line, the first gate electrode, and the second gate electrode.

7. The organic light emitting display device as claimed in claim 6, wherein the data line except for a portion of the data line crossing the gate line and the voltage line except for a portion of the voltage line crossing the gate line are disposed on the insulating layer in the trench area.

8. The organic light emitting display device as claimed in claim 4, further comprising:
a protective layer, the protective layer being disposed on the substrate to cover the first and second transistors; and
a pixel definition layer, the pixel definition layer being disposed on the protective layer, wherein each pixel includes:
an opening in the pixel definition layer, and
a contact hole in the protective layer, the contact hole penetrating the protective layer to expose a portion of the second drain electrode.

9. The organic light emitting display device as claimed in claim 8, wherein the organic light emitting device includes:
a first electrode, the first electrode being coupled to the second drain electrode through the contact hole, the first electrode being partially exposed by the opening;
an organic light emitting layer, the organic light emitting layer being disposed on the first electrode in the opening; and
a second electrode, the second electrode being disposed on the organic light emitting layer.

10. The organic light emitting display device as claimed in claim 9, wherein a boundary of the organic light emitting layer overlaps the data line, the voltage line, and another gate line.

11. A method of manufacturing an organic light emitting display device, the method comprising:
preparing a substrate;
forming a gate line extended in a row direction, and forming a gate electrode of a driving transistor;
etching a portion of the substrate to a predetermined depth to etch a trench area in the substrate, an area of the substrate that is not etched forming a protrusion pattern having a first height, the trench area having a second height lower than the first height, and the gate line and the gate electrode of the driving transistor being on and overlapping the protrusion pattern;
forming an insulating layer on the substrate to cover the gate line and the gate electrode of the driving transistor;
forming a semiconductor layer on the insulating layer to cover the gate electrode of the driving transistor;
forming a source electrode of the driving transistor and a drain electrode of the driving transistor on the insulating layer and the semiconductor layer, the source electrode of the driving transistor and the drain electrode of the driving transistor being spaced apart from each other, and forming a data line extended in a column direction crossing the row direction on the insulating layer; and
forming an organic light emitting device coupled to the drain electrode of the driving transistor.

12. The method as claimed in claim 11, further comprising:
forming a first capacitor electrode and a second capacitor electrode partially overlap the first capacitor electrode, the insulating layer being interposed between the first capacitor electrode and the second capacitor electrode;
forming a switching transistor coupled the data line, the first capacitor electrode, and another gate line; and
forming a voltage line extended in the column direction on the insulating layer, wherein:
the first capacitor electrode is formed on and overlaps the protrusion pattern,
the first capacitor electrode is coupled to the gate electrode of the driving transistor, and
the voltage line is coupled to the second capacitor electrode and the source electrode of the driving transistor.

13. The method as claimed in claim 12, wherein the data line except for a portion of the data line crossing the gate line and the voltage line except for a portion of the voltage line crossing the gate line are formed on the insulating layer in the trench area.

14. The method as claimed in claim 12, wherein:
the protrusion pattern has a protruding feature that has a same width as the gate line overlapping the protrusion pattern,
the protrusion pattern has a protruding feature that has a same width as the gate electrode overlapping the protrusion pattern, and
the protrusion pattern has a protruding feature that has a same area as the first capacitor electrode overlapping the protrusion pattern when viewed in a plan view.

15. The method as claimed in claim 12, further comprising:
forming a protective layer on the substrate to cover the driving transistor and the switching transistor;
forming a contact hole through the protective layer to expose an area of the drain electrode of the driving transistor; and
forming a pixel definition layer on the protective layer, the pixel definition layer having an opening formed therethrough.

16. The method as claimed in claim 15, wherein the forming of the organic light emitting device includes:
forming a first electrode on the protective layer to be coupled to the drain electrode of the driving transistor through the contact hole, the first electrode being partially exposed through the opening;
forming an organic light emitting layer on the first electrode, the organic light emitting layer being formed on the first electrode in the opening; and
forming a second electrode on the pixel definition layer and the organic light emitting layer.

17. The method as claimed in claim 16, wherein a boundary of the organic light emitting layer overlaps the data line, the voltage line, and the gate line.

18. The method as claimed in claim 11, wherein the etching of the substrate is performed by a wet etch method with phosphoric acid, nitric acid, and hydrofluoric acid.

* * * * *